United States Patent
Wang et al.

(10) Patent No.: US 11,405,012 B2
(45) Date of Patent: Aug. 2, 2022

(54) BALUN AND METHOD FOR MANUFACTURING THE SAME

(71) Applicant: Telefonaktiebolaget LM Ericsson (publ), Stockholm (SE)

(72) Inventors: Zhancang Wang, Beijing (CN); Chen He, Beijing (CN)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 0 days.

(21) Appl. No.: 17/258,016

(22) PCT Filed: Jul. 8, 2018

(86) PCT No.: PCT/CN2018/096132
§ 371 (c)(1),
(2) Date: Jan. 5, 2021

(87) PCT Pub. No.: WO2020/014891
PCT Pub. Date: Jan. 23, 2020

(65) Prior Publication Data
US 2021/0281236 A1 Sep. 9, 2021

(51) Int. Cl.
*H03H 7/42* (2006.01)
*H01P 3/08* (2006.01)
(Continued)

(52) U.S. Cl.
CPC ............. *H03H 7/42* (2013.01); *H01P 3/081* (2013.01); *H01P 5/10* (2013.01); *H01P 5/16* (2013.01); *H03H 3/00* (2013.01)

(58) Field of Classification Search
CPC ... H01P 3/081; H01P 5/10; H01P 5/16; H03H 7/42; H03H 3/00
See application file for complete search history.

(56) References Cited

U.S. PATENT DOCUMENTS 7,302,249 B1 11/2007 Fudem et al.
7,605,672 B2 10/2009 Kirkeby
(Continued)

FOREIGN PATENT DOCUMENTS

CN 104022322 A 9/2014
CN 105990630 A 10/2016
JP 2017121088 A * 7/2017

OTHER PUBLICATIONS

Anonymous, "Balun—Genesys 2008 07 Keysight Knowledge Center", p. 1, Jun. 2, 2008, retrieved from the Internet: URL: https://edadocs.software.keysight.com/display/genesys200807/Balun [retrieved on Jan. 18, 2022].

(Continued)

*Primary Examiner* — Stephen E. Jones
*Assistant Examiner* — Kimberly E Glenn
(74) *Attorney, Agent, or Firm* — Coats & Bennett, PLLC

(57) ABSTRACT

A balun and a method for manufacturing the same are disclosed. According to an embodiment, the balun comprises a substrate, and a first and a second coplanar waveguide (CPW) couplers which are disposed on the substrate and cascaded with each other. Each CPW coupler comprises two first ground planes disposed on a first side of the substrate, a first microstrip line and at least two second microstrip lines which are disposed on the first side of the substrate between the two first ground planes, and at least one third microstrip line that is disposed on an opposite side of the substrate. The first microstrip line and the at least two second microstrip lines can be coupled with each other by electromagnetic coupling. The at least one third microstrip line electrically connects the at least two second microstrip lines with each other by via-holes.

17 Claims, 7 Drawing Sheets

(51) Int. Cl.
    *H01P 5/10*     (2006.01)
    *H01P 5/16*     (2006.01)
    *H03H 3/00*     (2006.01)

(56) References Cited

U.S. PATENT DOCUMENTS

| | | |
|---|---|---|
| 8,547,186 B2 | 10/2013 | Kirkeby |
| 2012/0049971 A1 | 3/2012 | Gerst et al. |

OTHER PUBLICATIONS

Chiu, J. et al., "A 3-dB Quadrature Coupler Suitable for PCB Circuit Design", IEEE Transactions on Microwave Theory and Techniques, Sep. 2006, pp. 3521-3525, vol. 54, No. 9.

\* cited by examiner

BALUN AND METHOD FOR MANUFACTURING THE SAME

TECHNICAL FIELD

Embodiments of the disclosure generally relate to radio frequency (RF) and microwave components, and, more particularly, to a balun and a method for manufacturing the same.

BACKGROUND

This section introduces aspects that may facilitate better understanding of the present disclosure. Accordingly, the statements of this section are to be read in this light and are not to be understood as admissions about what is in the prior art or what is not in the prior art.

A balun ("balanced-to-unbalanced") is a known type of electrical component. A balun is a two-port electronic device that transforms a signal between a signal suitable for a balanced transmission line and a signal suitable for an unbalanced transmission line. The two ports of the balun are referred to as the unbalanced port (referenced to ground) and the balanced port (two terminals, one referenced to the other). Applications for balun transformers include antenna feed circuitry, push-pull amplifiers, circuitry for splitting and combining signals and other circuitry where transformation from balanced to unbalanced signals is required. A balun may also function as a transformer and is often used as a means to change or match impedances within a portion of a RF network. Balanced signals require two transmission paths. One path carries a first signal and the other path carries a second signal that is of equal amplitude and opposite in phase to the first signal. This arrangement is typically employed to cancel the deleterious effects of noise and interference that might otherwise degrade a single-ended signal. On the other hand, there are certain components in RF and wireless devices, such as power amplifiers and antennas, which are typically implemented as single ended signal devices. Accordingly, a balun is required when a device includes single-ended and differential components in a signal path.

It is often the case that one stage of a communication system employs differential signals (i.e., balanced signals) and a subsequent stage employs unbalanced signals. A differential signal includes two signal paths, each being 180° out of phase with the other. An unbalanced line is simply implemented as a single signal path. For example, certain antennas are balanced structures that require a balanced feed. However, the system may be such that the signal source is an unbalanced RF transmitter. This situation may also present itself in the opposite direction as well. A push/pull amplifier, for example, may provide a balanced differential signal for subsequent use by an unbalanced antenna.

Baluns are typically implemented using several coupled transmission lines, i.e., directional couplers. The couplers are four-port passive devices that are commonly employed in radio-frequency (RF) and microwave circuits and systems. A coupler may be implemented by disposing two conductors in relative proximity to each other such that an RF signal propagating along a main conductor is coupled to a secondary conductor. The RF signal is directed into an input port connected to the main conductor and the power is transmitted to an output port disposed at the distal end of the main conductor. An electromagnetic field is coupled to the secondary conductor and the coupled RF signal is directed into an output port disposed at an end of the secondary conductor. The output signals are 90° out of phase with each other. An isolation port is disposed at the other end of the secondary conductor. The term isolation port refers to the fact that, ideally, the RF signal is not available at this port. At the isolation port, the incident signal and the coupled signal are substantially out of phase with each other and cancel each other out.

SUMMARY

This summary is provided to introduce a selection of concepts in a simplified form that are further described below in the detailed description. This summary is not intended to identify key features or essential features of the claimed subject matter, nor is it intended to be used to limit the scope of the claimed subject matter.

One of the objects of the disclosure is to provide an improved solution for a balun.

According to one aspect of the disclosure, there is provided a balun. The balun comprises a substrate, and a first and a second coplanar waveguide (CPW) couplers which are disposed on the substrate and cascaded with each other. Each CPW coupler comprises two first ground planes disposed on a first side of the substrate. Each CPW coupler further comprises a first microstrip line and at least two second microstrip lines which are disposed on the first side of the substrate between the two first ground planes, and can be coupled with each other by electromagnetic coupling. Each CPW coupler further comprises at least one third microstrip line that is disposed on an opposite side of the substrate and electrically connects the at least two second microstrip lines with each other by via-holes.

In an embodiment of the disclosure, each CPW coupler comprises two second ground planes which are disposed on the opposite side of the substrate and electrically connected to the two first ground planes by via-holes respectively.

In an embodiment of the disclosure, the first microstrip line has one end called a first port and the other end called a third port. The at least two second microstrip lines connected as a whole has one end called a second port and the other end called a fourth port. The first port of the first CPW coupler is an unbalanced port. The second port of the first CPW coupler and the third port of the second CPW coupler are balanced ports.

In an embodiment of the disclosure, the third port of the first CPW coupler is connected with the second port of the second CPW coupler via a first impedance transformer. The fourth port of the first CPW coupler is connected to ground via a third impedance transformer. The first port of the second CPW coupler is connected to ground via a fourth impedance transformer. The fourth port of the second CPW coupler is connected to ground via a second impedance transformer.

In an embodiment of the disclosure, the fourth port of the first CPW coupler is connected to the second ground plane by a via-hole. The first port of the second CPW coupler is connected to the second ground plane by a via-hole.

In an embodiment of the disclosure, a length of a coupling region between the first microstrip line and adjacent second microstrip lines is configured to define a desired center frequency of the CPW coupler.

In an embodiment of the disclosure, a spacing between the first microstrip line and adjacent second microstrip lines is configured to define a coupling degree of the CPW coupler.

In an embodiment of the disclosure, at least one of a width of the first microstrip line and a width of the second microstrip line is configured to define an impedance of the CPW coupler.

In an embodiment of the disclosure, the first microstrip line and the at least two second microstrip lines are disposed in parallel with each other.

In an embodiment of the disclosure, the at least one third microstrip line is disposed perpendicular to the first microstrip line or the at least two second microstrip lines.

In an embodiment of the disclosure, the first microstrip line takes the form of S-shape, and the second microstrip line takes the form of L-shape.

In an embodiment of the disclosure, a number of the at least one third microstrip line is two.

In an embodiment of the disclosure, the balun is configured to operate over a broadband frequency range.

In an embodiment of the disclosure, the first CPW coupler has the same size as the second CPW coupler.

According to another aspect of the disclosure, there is provided a RF device comprising the balun according to the above aspect.

According to another aspect of the disclosure, there is provided a method for manufacturing a balun. The method comprises providing a substrate and forming a first and a second cascaded CPW couplers on the substrate. Forming each CPW coupler comprises forming two first ground planes on a first side of the substrate. Forming each CPW coupler further comprises forming, on the first side of the substrate between the two first ground planes, a first microstrip line and at least two second microstrip lines which can be coupled with each other by electromagnetic coupling. Forming each CPW coupler further comprises forming, on an opposite side of the substrate, at least one third microstrip line that electrically connects the at least two second microstrip lines with each other by via-holes.

In an embodiment of the disclosure, forming each CPW coupler comprises forming, on the opposite side of the substrate, two second ground planes which are electrically connected to the two first ground planes by via-holes respectively.

According to some embodiment(s) of the disclosure, the balun can be designed on a single-layer substrate without using bonding wires to crossover signal lines.

BRIEF DESCRIPTION OF THE DRAWINGS

These and other objects, features and advantages of the disclosure will become apparent from the following detailed description of illustrative embodiments thereof, which are to be read in connection with the accompanying drawings.

DETAILED DESCRIPTION

For the purpose of explanation, details are set forth in the following description in order to provide a thorough understanding of the embodiments disclosed. It is apparent, however, to those skilled in the art that the embodiments may be implemented without these specific details or with an equivalent arrangement.

Figure 1:
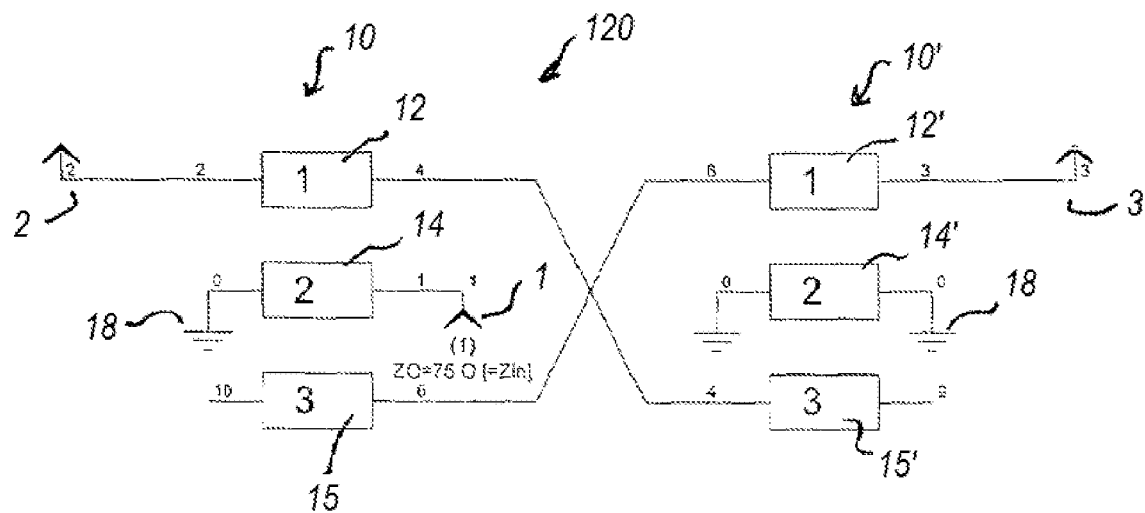
FIG. 1 is a diagram showing a balun of prior art 1.

In U.S. Pat. No. 7,605,672B2 (denoted as prior art 1 herein), as shown in FIG. 1, a balun 120 includes a first coupler structure 10 having a first port 2 of a balanced port pair (2, 3) and an unbalanced port 1. The balun 120 further includes a second coupler structure 10' having a second port 3 of the balanced port pair (2, 3). The second coupler structure 10' is connected to the first coupler structure 10 such that the second port 3 of the balanced port pair (2, 3) is direct current (DC) isolated from the first port 2 of the balanced port pair (2, 3) without decoupling components.

The first coupler structure 10 includes a first transmission line layer 12 coupled to a second transmission line layer 14 and a third transmission line layer 15 coupled to the second transmission layer 14. The second transmission line layer 14 is disposed between the first transmission line layer 12 and the third transmission line layer 15. The second coupler structure 10' also includes a fourth transmission line layer 12' coupled to a fifth transmission line layer 14' and a sixth transmission line layer 15' coupled to the fifth transmission layer 14'. The fifth transmission line layer 14' is disposed between the fourth transmission line layer 12' and the sixth transmission line layer 15'. The first transmission line layer 12 is connected to the sixth transmission line layer 15' and the third transmission line layer 15 is connected to the fourth transmission line layer 12' such that the first port 2 of the balanced port pair (2, 3) is DC isolated from the second port 3 of the balanced port pair (2, 3).

Figure 2:
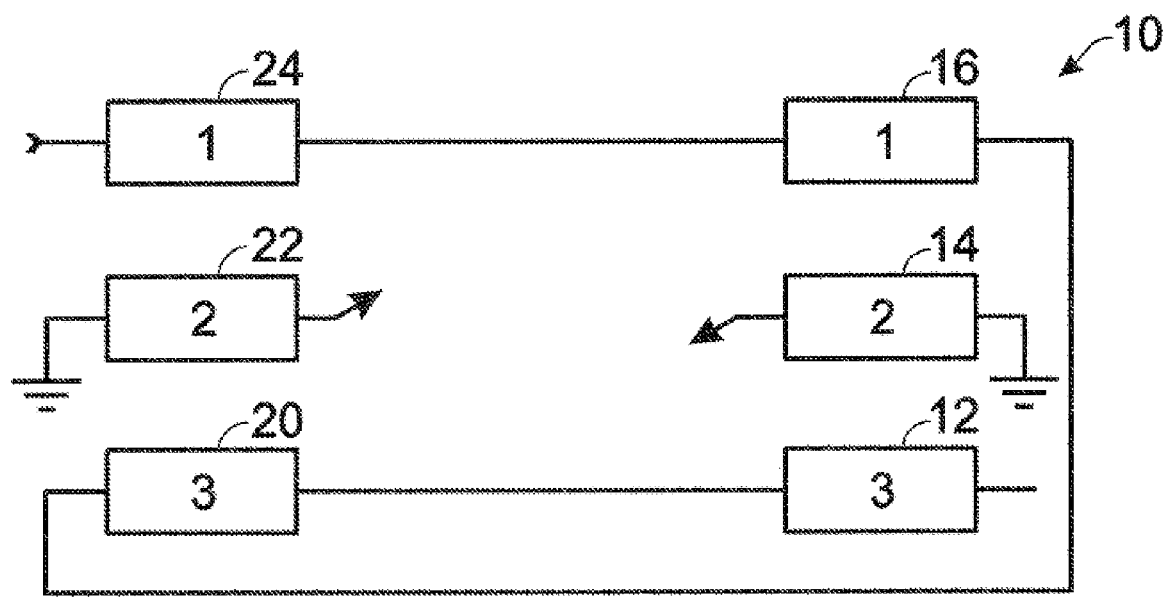
FIG. 2 is a diagram showing a balun of prior art 2.

In U.S. Pat. No. 8,547,186B2 (denoted as prior art 2 herein), as shown in FIG. 2, a compact Marchand balun 10 includes an unbalanced port and a set of balanced differential ports. A first set of coupled transmission line structures (24, 22, 20) is coupled to the unbalanced port and one port of the set of balanced differential ports. The first set of coupled transmission line structures (24, 22, 20) is characterized by at least one device parameter and a first length that is substantially equal to a quarter of a wavelength ($\lambda$). The wavelength ($\lambda$) corresponds to a first frequency. A second set of coupled transmission line structures (16, 14, 12) is coupled to another port of the set of balanced differential ports. The second set of coupled transmission line structures (16, 14, 12) is characterized by the at least one device parameter and a second length that is substantially equal to the quarter of a wavelength ($\lambda$). The wavelength ($\lambda$) corresponds to the first frequency.

A plurality of interconnections couples the first set of coupled transmission line structures (24, 22, 20) and the second set of coupled transmission line structures (16, 14, 12). The plurality of interconnections is configured such that the compact balun 10 operates at a reduced operating frequency. The reduced operating frequency is selected from a range of frequencies by varying the at least one device parameter. The range of frequencies is approximately between one-sixth of the first frequency and one-half the first frequency.

Figure 3:
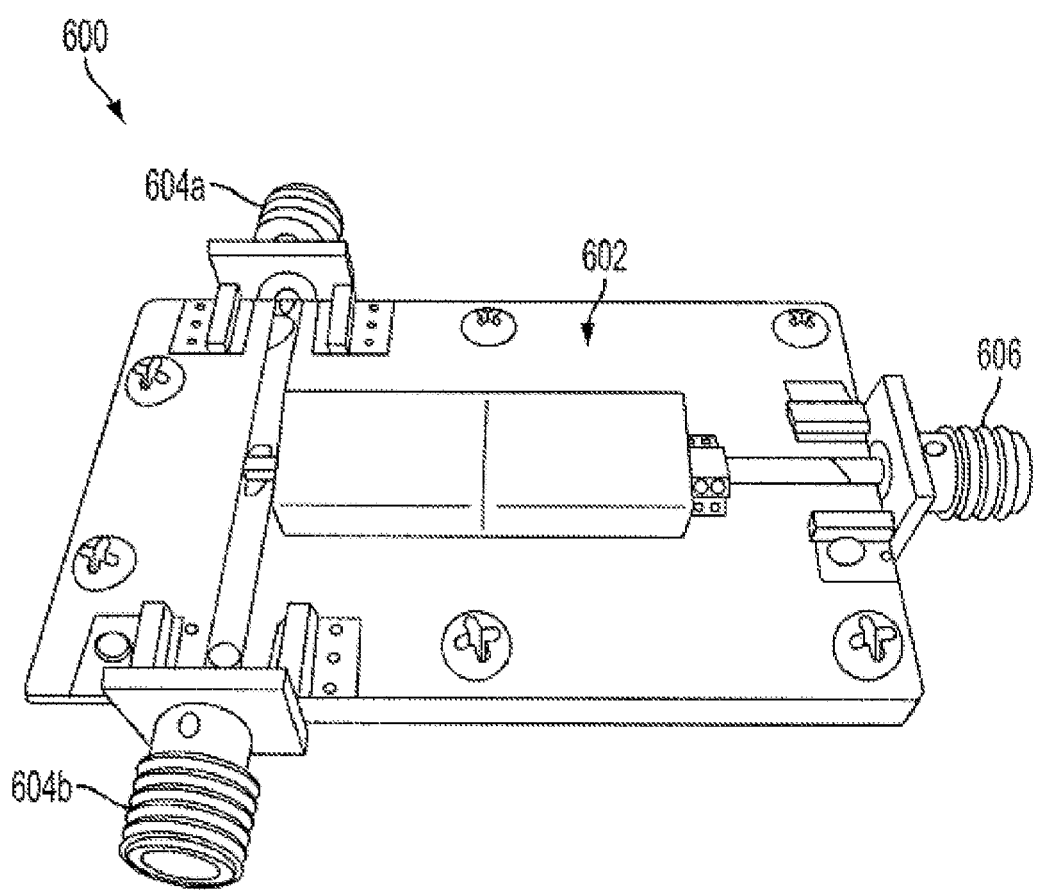
FIG. 3 is a diagram showing a balun of prior art 3.

In US2012/0049971A1 (denoted as prior art 3 herein), as shown in FIG. 3, a balun 600 includes a balanced port (604a, 604b), an unbalanced port 606, a first pair of coupled lines, a magnetic material member 602 that encloses the first pair of coupled lines and an electrically conductive member arranged to field-enclose the first pair of coupled lines. The magnetic material is selected so that: (i) it is ferrimagnetic; and (ii) electrically non-conductive. Not every ferrimagnetic, non-electrically conductive material will necessarily work. Preferred embodiments of prior art 3 have operating frequencies in the frequency range of 30 MHz to 1000 MHz.

In prior arts 1 and 2, although the strip lines with certain widths and coupling spacing can easily be implemented by certain special technology such as low temperature co-fired ceramic (LTCC), semiconductor chipset, etc., when they go to printed circuit board (PCB) design, the manufacture is difficult to be realized because the limitation of the tightly coupled structure and wire bonding processes that cannot be easily realized by using PCB process. For example, to realize the tightly coupled structure in prior arts 1 and 2 on PCB, the conductor widths and the spacing between conductors become prohibitively small, which may cause manufacture trouble by suffering extra yield loss or even impossible to be implemented in PCB process at all.

In addition, in prior arts 1 and 2, they both use a multi-layer structure to fabricate a floating potential conductor over a dielectric overlay signal line. These circuits may also require some special requirements such as bonding wires or multi-layer substrates to implement a broadband balun device. Therefore, they are limited and inconvenient to PCB circuit design for simplicity and low cost.

In prior art 3, since it uses a magnetic material member (ferrite) that encloses the coupled lines, the usage of ferrite may limit the frequency of application. For example, prior art 3 only targets for 30 MHz to 1000 MHz. For higher frequency bands of telecommunications, e.g. B1 (2.1 GHz), B7 (2.6 GHz), B42 (3.5 GHz), B43 (3.8 GHz), it may be difficult to achieve such a high frequency due to the limitation of the usage of ferrite material. Thus, prior art 3 cannot provide sufficiently good performance for 1000 MHz broad bandwidth targeting for 5th generation (5G) applications.

Figure 4:
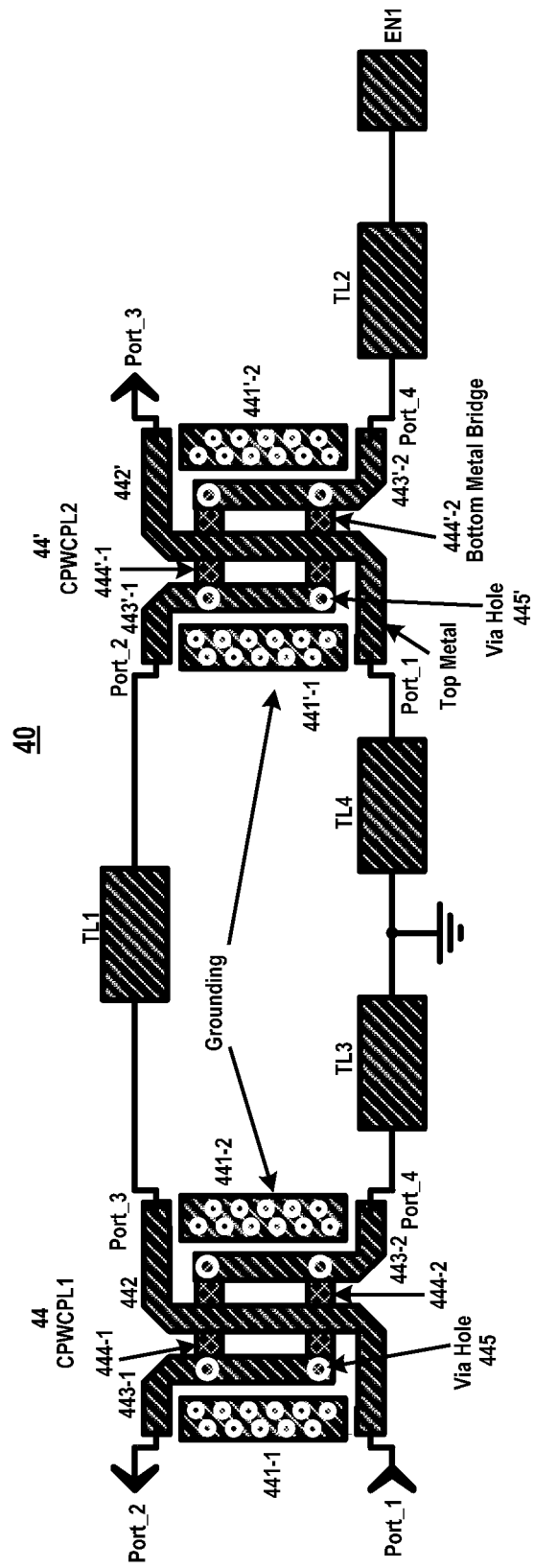
FIG. 4 is a schematic diagram showing a balun according to an embodiment of the disclosure.
Figure 5:
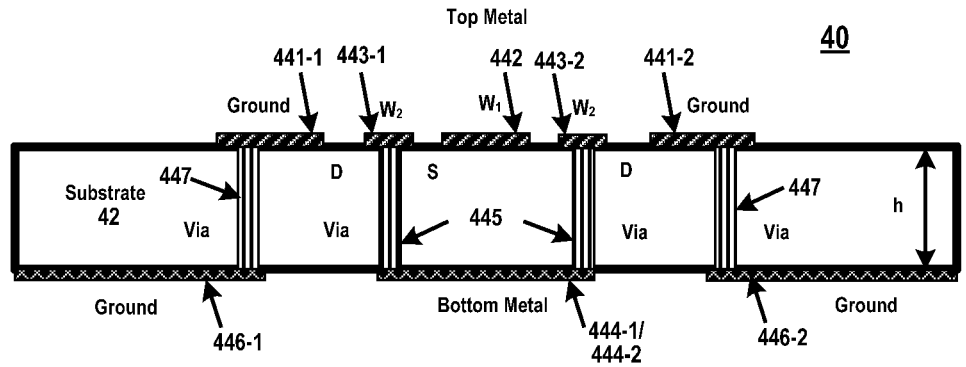
FIG. 5 is a sectional view showing the balun of FIG. 4.

The present disclosure proposes an improved solution for a balun. The basic idea is utilizing a coplanar waveguide (CPW) structure to combine with microstrip (uStrip) line structure. Because the CPW circuit owns more geometrical parameters and will not be limited by the substrate thickness, the hybrid structure of the balun can have additional degree of freedom to achieve wider bandwidth in design. Hereinafter, the solution will be described in detail with reference to FIGS. 4-9. FIG. 4 is a schematic diagram showing a balun according to an embodiment of the disclosure. FIG. 5 is a sectional view showing the balun of FIG. 4. As shown in FIGS. 4 and 5, the balun 40 comprises a substrate 42, a first CPW coupler 44 (also shown as CPWCPL1 in FIG. 4) and a second CPW coupler 44' (also shown as CPWCPL2 in FIG. 4). The substrate 42 may be a planar dielectric substrate. The first and second CPW couplers 44, 44' are disposed on the substrate 42 and cascaded with each other. The two CPW couplers may be made from conductive material such as metal. The first CPW coupler 44 may have the same structure and size as the second CPW coupler 44'. Thus, only the first CPW coupler 44 will be described in detail below.

The first CPW coupler 44 comprises two first ground planes 441-1 and 441-2, a first microstrip line 442, two second microstrip lines 443-1 and 443-2, and two third microstrip lines 444-1 and 444-2. The two first ground planes 441-1 and 441-2 are disposed on a first side of the substrate 42 (e.g. the upper side in FIG. 5). The first microstrip line 442 and the two second microstrip lines 443-1, 443-2 are disposed on the first side of the substrate 42 between the two first ground planes 441-1, 441-2, and can be coupled with each other by electromagnetic coupling. In the example shown in FIG. 4, the first microstrip line 442 is disposed in parallel with the two second microstrip lines 443-1, 443-2. The first microstrip line 442 takes the form of S-shape, and the two second microstrip lines 443-1, 443-2 take the form of L-shape. The two third microstrip lines 444-1, 444-2 are disposed on an opposite side of the substrate 42 (e.g. the lower side in FIG. 5) and electrically connects the two second microstrip lines 443-1, 443-2 with each other by via-holes 445. In the example shown in FIG. 4, the two third microstrip lines 444-1, 444-2 are disposed in parallel with each other. Thus, the two third microstrip lines 444-1, 444-2 are disposed perpendicular to the first microstrip line 442 and the two second microstrip lines 443-1, 443-2.

It should be noted that the present disclosure is not limited to the above example. As another example, there may be more than two second microstrip lines. In this case, on each of the two sides of the first microstrip line, there may be one or more second microstrip lines. As still another example, there may be only one third microstrip line or more than two third microstrip lines. In other words, there may be at least one third microstrip line as long as the at least two second microstrip lines can be connected as a whole. As still another example, any other suitable shapes and/or arrangements of the first to third microstrip lines may be used as long as the at least two second microstrip lines connected as a whole can be coupled with the first microstrip line to form a coupler.

Since a CPW structure is used, a ground plane formed on the opposite side of the substrate can be eliminated in the area corresponding to the CPW coupled lines. Thus, the at least two second microstrip lines can be connected as a whole by using the third microstrip line(s) and via-holes, without using bonding wires which are required for manufacturing in semiconductor process. Thus, the balun can be designed on a single-layer substrate without using bonding wires to crossover signal lines. This is compatible for general printed circuit processes, which means the balun does not require special and expensive substrate and multi-layer technology for manufacture. In addition, the CPW coupler has a multiple-finger CPW coupled line structure and the number of the fingers is at least three. This results in that the widths and the spacing of the coupled lines can be adjusted by changing the position of the CPW ground plane to match the minimum requirements of the PCB manufacture. As a result, the too narrow strip width and coupling spacing problems of prior arts 1 and 2 can be solved. Compared with prior 3, magnetic material can be eliminated in the balun to realize broadband performance. Note that the present disclosure is not limited to PCB process alone.

As shown in FIG. 4, the first microstrip line 442 has one end (e.g. the left end in FIG. 4) called a first port (e.g. Port_1 in FIG. 4) and the other end (e.g. the right end in FIG. 4) called a third port (e.g. Port_3 in FIG. 4). The two second microstrip lines 443-1, 443-2 connected as a whole has one end (e.g. the left end in FIG. 4) called a second port (e.g. Port_2 in FIG. 4) and the other end (e.g. the right end in FIG. 4) called a fourth port (e.g. Port_4 in FIG. 4). Note that the above description about the ports also applies to the second CPW coupler 44'. The first port of the first CPW coupler 44 is an unbalanced port. The second port of the first CPW coupler 44 and the third port of the second CPW coupler 44' are balanced ports. As mentioned above, the balun is used to couple balanced and unbalanced transmission lines. Thus, the balanced lines (connected to Port_2 of CPWCPL1 and Port_3 of CPWCPL2) have two conductors of equal potential with a 180-degree phase difference. In the unbalanced line (connected to Port_1 of CPWCPL1), current flows through a grounded part such as a conducting shield.

As shown in FIG. 4, the third port of the first CPW coupler 44 is connected with the second port of the second CPW coupler 44' via a first impedance transformer. The first impedance transformer may be a quarter wavelength transmission line, e.g. TL1 in FIG. 4. The fourth port of the first CPW coupler 44 is connected to ground via a third impedance transformer. The third impedance transformer may be a quarter wavelength transmission line, e.g. TL3 in FIG. 4. The first port of the second CPW coupler 44' is connected to ground via a fourth impedance transformer. The fourth impedance transformer may be a quarter wavelength transmission line, e.g. TL4 in FIG. 4. The fourth port of the second CPW coupler is connected to ground via a second impedance transformer. The second impedance transformer may be a quarter wavelength transmission line, e.g. TL2 in FIG. 4. The function of the first to fourth impedance transformer is to implement impedance matching such that the output impedances are 25 Ohm or one half of the input impedance of 50 Ohm. Note that the block "EN1" shown in FIG. 4 refers to inductive grounding.

As shown in FIG. 5, the first CPW coupler 44 may comprise two second ground planes 446-1, 446-2 which are disposed on the opposite side of the substrate 42 (e.g. the lower side in FIG. 5) and electrically connected to the two first ground planes 441-1, 441-2 by via-holes 447 respectively. Thus, the fourth port of the first CPW coupler 44 may be connected to the second ground plane by a via-hole. The first port of the second CPW coupler 44' may be connected to the second ground plane by a via-hole. In the example shown in FIG. 4, the transmission lines (T-Lines) TL1~TL4 are placed on the top metal layer, and a via-hole may connect the TL3 and TL4 to the bottom metal layer. Optionally, the balun 40 may be housed within a milled pocket or cavity to prevent the back side from touching the ground plane in practical design.

Figure 6:
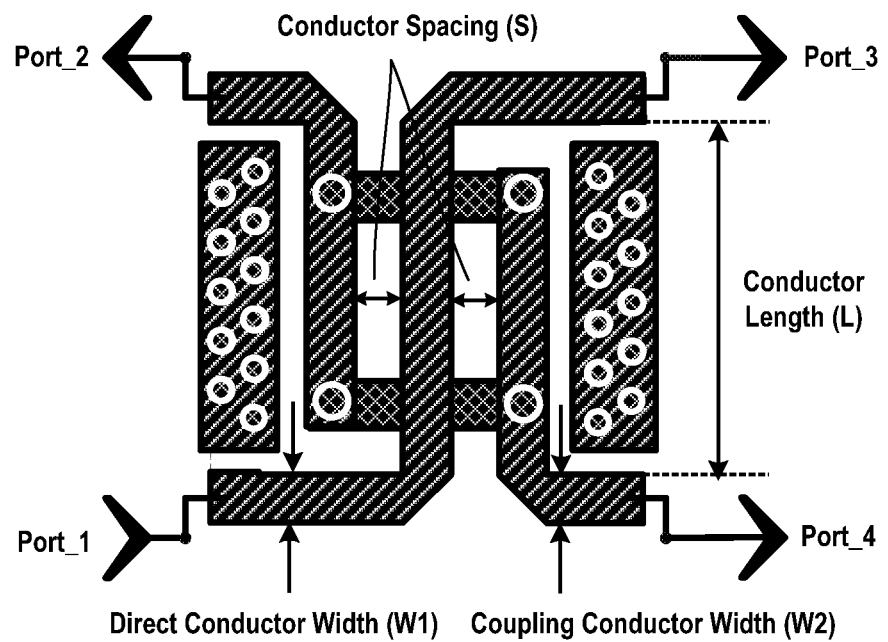
FIG. 6 is a schematic diagram showing a CPW coupler in the balun of FIG. 4.

FIG. 6 schematically shows the basic geometry of the CPW coupler in the balun of FIG. 4. In the CPW coupler, the phase of the coupled signal is 90 degrees out of phase with the input near the working frequency. Two such CPW couplers may be used in back to back way to construct a balun. As shown, the number of transmission lines (e.g. conductors) or fingers is three. The coupling is derived from closely spaced transmission lines. The CPW coupler may contain four geometry parameters for tuning the performance: the direct conductor width (W1), the coupling conductor width (W2), the conductor length/finger length (L), and conductor spacing (S). They may be derived from the design requirements and the chosen substrate. The design requirements may comprise coupling (S31), frequency range, reflection coefficients (S11, S22, S33) and isolation of the output ports (S23).

The width W1 and/or W2 may be configured to define the impedance of the CPW coupler. Depending on the specific application, W1 and W2 may be equal or not equal in value. The length L may be set by the desired center frequency of the CPW coupler. The length may be equivalent to a quarter wavelength transmission line counterpart at the center frequency in the substrate selected. Thus, the length of the coupling region between the first microstrip line and adjacent second microstrip lines may be configured to define the desired center frequency of the CPW coupler. The coupling characteristics are most sensitive to the conductor spacing or gap width (S) and the metal thickness (t) for a given set of fingers. The characteristics of the substrate are also a factor. For example, the CPW coupler may be designed for 3 dB of coupling (or half power splitting) between the input port (Port_1) and the coupled and direct ports ((Port_4 and Port_3). However, asymmetrical splitting ratio may be designed depending on the application requirements. Thus, the spacing between the first microstrip line and adjacent second microstrip lines may be configured to define the coupling degree of the CPW coupler.

Figure 7A:
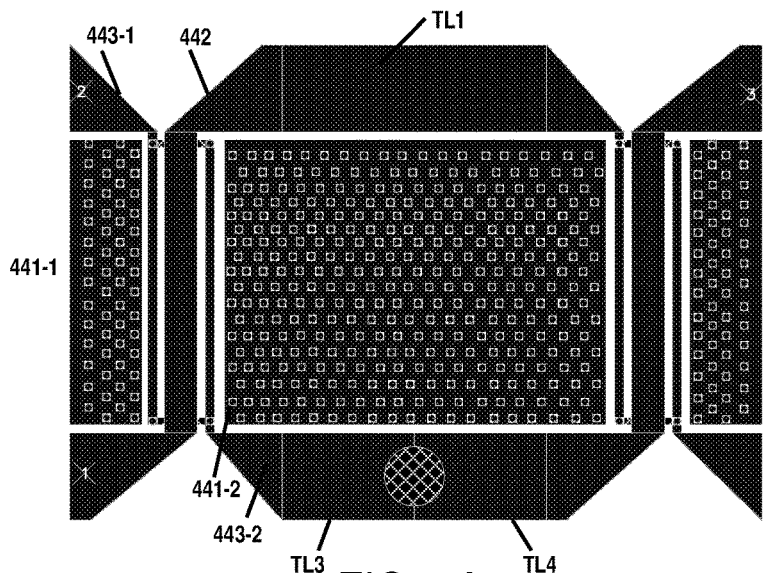
FIGS. 7A-7C are structural views each showing a balun according to an embodiment of the disclosure.
Figure 7B:
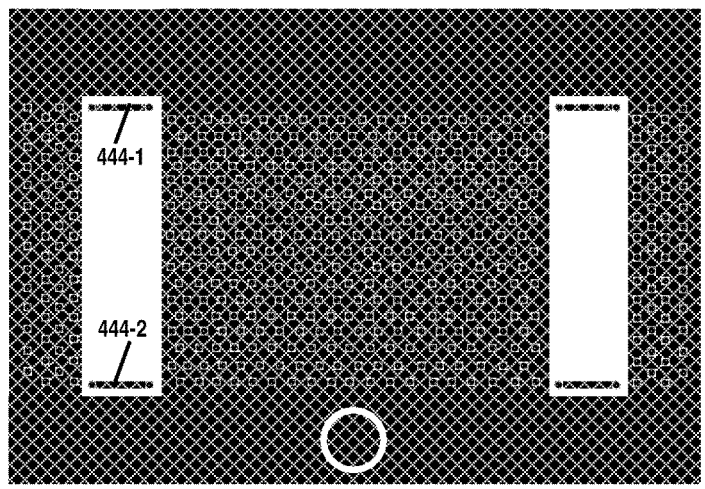
Figure 7C:
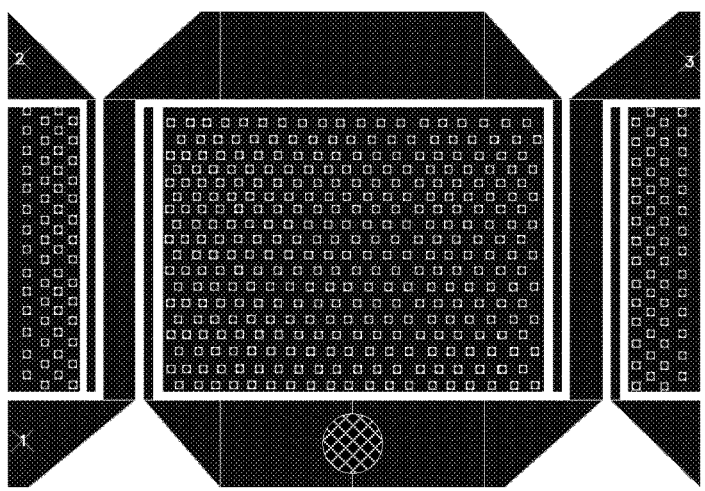

FIGS. 7A-7C are structural views each showing a balun according to an embodiment of the disclosure. FIG. 7A is a top view showing all layers of the balun. FIG. 7C is a top view showing only the top layer. As shown in FIGS. 7A and 7C, on the top layer, the circuit layout comprises two L-type metals 443-1, 443-2 connecting to isolated or coupled ports, an S-type metal 442 connecting from input port to direct port, and two ground plane metals 441-1, 441-2 which are outside the CPW three-finger coupled lines and connect to the bottom metal by via-holes. In order to form a CPW structure with the back-side ground connected to the top side, the back-side metal may be moved behind the top side ground pattern, leaving an overlap to connect the back-side ground to the top-side using via-holes. In the example shown in FIG. 7A, a large number of via-holes are used to connect to the ground plane to ensure that the CPW structure has a quasi-static transverse electromagnetic mode (TEM) mode. The length of the coupled region may be designed to match the quarter-wavelength of the center frequency to get the maximum signal coupling. FIG. 7B is a bottom view showing the bottom layer of the balun. As shown in FIG. 7B, on the bottom layer, because the ground plane below the CPW thee-finger coupled lines is eliminated, the two L-type metals 443-1, 443-2 can connect to two strip lines 444-1, 444-2 at the bottom layer by using four via-holes. Note that in the example shown in FIGS. 7A-7C, the first ground plane 441-2 of the left CPW coupler and the first ground plane 441'-1 of the right CPW coupler are combined as one ground plane.

Figure 8:
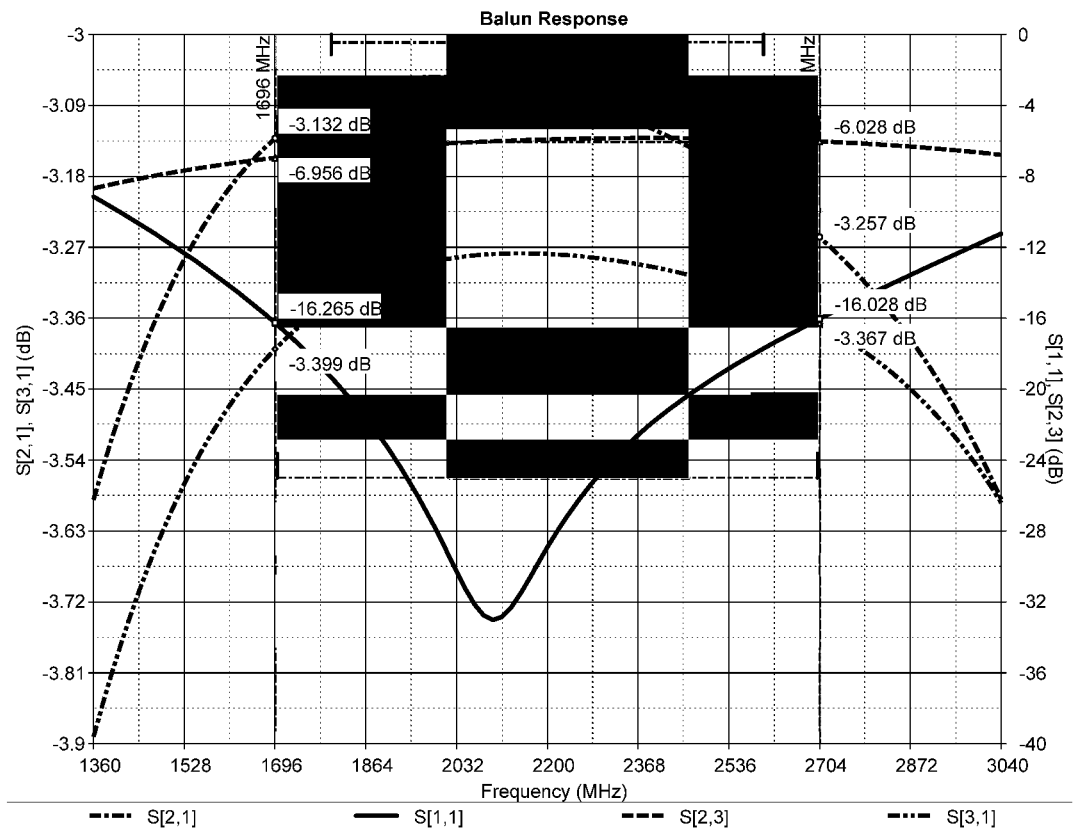
FIG. 8 shows simulated S-parameter curves for a balun according to an embodiment of the disclosure.

To verify the concept of present disclosure, a physical implementation simulation based on FIG. 4 was performed by using S-parameter metrics and centering the frequency on 2200 MHz (from 1700 MHz to 2700 MHz). FIG. 8 shows simulated S-parameter curves. As shown in FIG. 8, the insertion loss (S21, S31) for the balanced ports (Port_2 and Port_3) is about 3±0.3 dB. The coupling values (S23) at the balanced ports are quite similar over 1000 MHz bandwidth, which is much broader than prior arts. This indicates that the balun can successfully separate an incoming signal into two equivalent amplitude outputs. Due to the intrinsic non-isolation characteristic of a balun device, a typical isolation requirement is that S23<−6 dB. The measured isolation between Port_2 and Port_3 is also better than 6 dB. This implies that an incoming signal from Port_2 could have enough isolation to the other signal from Port_3 as a typical balun device. Thus, in this exemplary simulation example, the isolation between the balanced ports can also meet the requirement. FIG. 8 also depicts a simulated result of the return loss (S11) as a function of frequencies. For the frequency range over 1000 MHz bandwidth, the S11 is below −16 dB, which indicates an acceptable return loss characteristic. This means the balun according to the present disclosure can provide 1000 Mhz broad bandwidth performance to meet 5G broadband and high frequency requirements. For example, it may be deployed to middle and high frequency bands, e.g. B1, B7, B42 and B43 for telecommunication. Therefore, based on the simulated results, the performance is remarkably good considering the broadband character.

Figure 9:
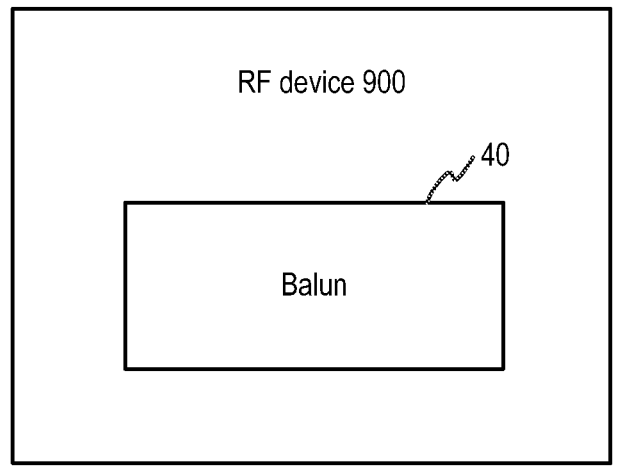
FIG. 9 is a block diagram showing a RF device according to an embodiment of the disclosure.

FIG. 9 is a block diagram showing a RF device according to an embodiment of the disclosure. As shown, the RF device 900 comprises the balun 40 described above. As an example, the RF device 900 may be a base station such as evolved Node B (eNB), gNB, or the like. For instance, the balun may be used for broadband power amplifier applications. As another example, the RF device 900 may be a terminal device. The terminal device may also be referred to as, for example, user equipment (UE), mobile station, mobile unit, subscriber station, access terminal, or the like. It may refer to any end device that can access a wireless communication network and receive services therefrom. By way of example and not limitation, the terminal device may include portable computers, image capture terminal devices such as digital cameras, gaming terminal devices, music storage and playback appliances, a mobile phone, a cellular phone, a smart phone, a tablet, a wearable device, a personal digital assistant (PDA), or the like.

In an Internet of things (IoT) scenario, a terminal device may represent a machine or other device that performs monitoring and/or measurements, and transmits the results of such monitoring and/or measurements to another terminal device and/or a network equipment. In this case, the terminal device may be a machine-to-machine (M2M) device, which may, in a 3GPP context, be referred to as a machine-type communication (MTC) device. Particular examples of such machines or devices may include sensors, metering devices such as power meters, industrial machinery, bikes, vehicles, or home or personal appliances, e.g. refrigerators, televisions, personal wearables such as watches, and so on.

Figure 10:
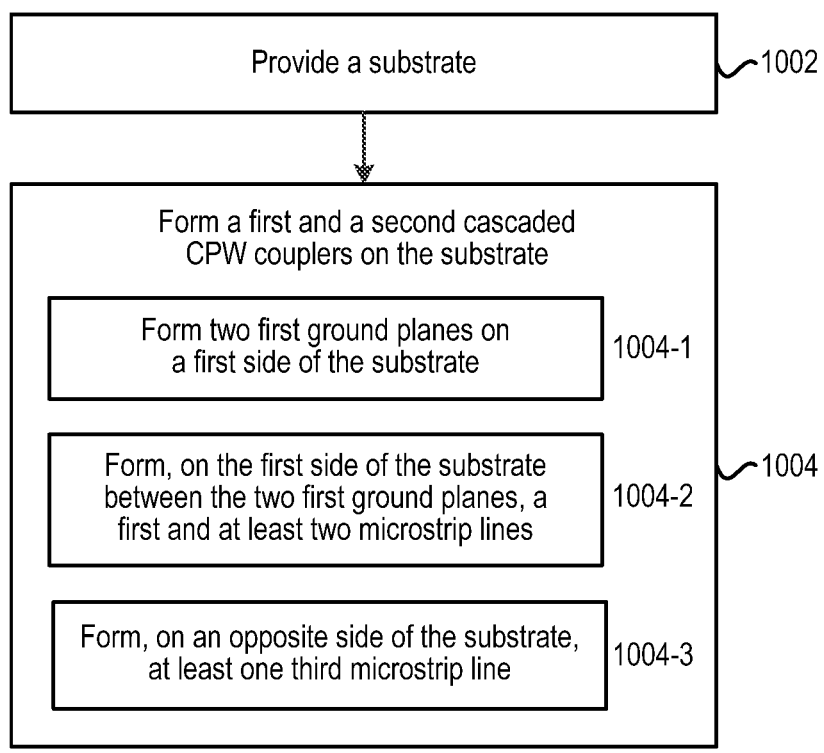
FIG. 10 is a flowchart illustrating a method for manufacturing a balun according to an embodiment of the disclosure.

FIG. 10 is a flowchart illustrating a method for manufacturing a balun according to an embodiment of the disclosure. At block 1002, a substrate is provided. As described above, the substrate may be a planar dielectric substrate. At block 1004, a first and a second cascaded CPW couplers are formed on the substrate. The forming of each CPW coupler may include sub-blocks 1004-1 to 1004-3. At sub-block 1004-1, two first ground planes are formed on a first side of the substrate. At sub-block 1004-2, a first microstrip line and at least two second microstrip lines are formed on the first side of the substrate between the two first ground planes. The first microstrip line and the at least two second microstrip lines can be coupled with each other by electromagnetic coupling. At sub-block 1004-3, at least one third microstrip line is formed on an opposite side of the substrate. The at least one third microstrip line electrically connects the at least two second microstrip lines with each other by via-holes. Each of the above sub-blocks may be performed by a patterning process. Note that one or more of the above sub-blocks may be performed in the same one patterning process. In addition, the forming of each CPW coupler in block 1004 may further include forming, on the opposite side of the substrate, two second ground planes which are electrically connected to the two first ground planes by via-holes respectively. The structure of the CPW coupler has been described above and its details are omitted here. It should be noted that two blocks shown in succession may, in fact, be executed substantially concurrently, or the blocks may sometimes be executed in the reverse order, depending upon the functionality involved.

In general, the various exemplary embodiments may be implemented in hardware or special purpose circuits, software, logic or any combination thereof. For example, some aspects may be implemented in hardware, while other aspects may be implemented in firmware or software which may be executed by a controller, microprocessor or other computing device, although the disclosure is not limited thereto. While various aspects of the exemplary embodiments of this disclosure may be illustrated and described as block diagrams, flow charts, or using some other pictorial representation, it is well understood that these blocks, apparatus, systems, techniques or methods described herein may be implemented in, as non-limiting examples, hardware, software, firmware, special purpose circuits or logic, general purpose hardware or controller or other computing devices, or some combination thereof.

As such, it should be appreciated that at least some aspects of the exemplary embodiments of the disclosure may be practiced in various components such as integrated circuit chips and modules. It should thus be appreciated that the exemplary embodiments of this disclosure may be realized in an apparatus that is embodied as an integrated circuit, where the integrated circuit may comprise circuitry (as well as possibly firmware) for embodying at least one or more of a data processor, a digital signal processor, baseband circuitry and radio frequency circuitry that are configurable so as to operate in accordance with the exemplary embodiments of this disclosure.

It should be appreciated that at least some aspects of the exemplary embodiments of the disclosure may be embodied in computer-executable instructions, such as in one or more program modules, executed by one or more computers or other devices. Generally, program modules include routines, programs, objects, components, data structures, etc. that perform particular tasks or implement particular abstract data types when executed by a processor in a computer or other device. The computer executable instructions may be stored on a computer readable medium such as a hard disk, optical disk, removable storage media, solid state memory, RAM, etc. As will be appreciated by one of skill in the art, the function of the program modules may be combined or distributed as desired in various embodiments. In addition, the function may be embodied in whole or in part in firmware or hardware equivalents such as integrated circuits, field programmable gate arrays (FPGA), and the like.

References in the present disclosure to "one embodiment", "an embodiment" and so on, indicate that the embodiment described may include a particular feature, structure, or characteristic, but it is not necessary that every embodiment includes the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to implement such feature, structure, or characteristic in connection with other embodiments whether or not explicitly described.

It should be understood that, although the terms "first", "second" and so on may be used herein to describe various elements, these elements should not be limited by these terms. These terms are only used to distinguish one element from another. For example, a first element could be termed a second element, and similarly, a second element could be termed a first element, without departing from the scope of the disclosure. As used herein, the term "and/or" includes any and all combinations of one or more of the associated listed terms.

The terminology used herein is for the purpose of describing particular embodiments only and is not intended to limit the present disclosure. As used herein, the singular forms "a", "an" and "the" are intended to include the plural forms as well, unless the context clearly indicates otherwise. It will be further understood that the terms "comprises", "comprising", "has", "having", "includes" and/or "including", when used herein, specify the presence of stated features, elements, and/or components, but do not preclude the presence or addition of one or more other features, elements, components and/or combinations thereof. The terms "connect", "connects", "connecting" and/or "connected" used herein cover the direct and/or indirect connection between two elements.

The present disclosure includes any novel feature or combination of features disclosed herein either explicitly or any generalization thereof. Various modifications and adaptations to the foregoing exemplary embodiments of this disclosure may become apparent to those skilled in the relevant arts in view of the foregoing description, when read in conjunction with the accompanying drawings. However, any and all modifications will still fall within the scope of the non-Limiting and exemplary embodiments of this disclosure.

What is claimed is:

1. A balun, comprising:
    a substrate;
    first and second coplanar waveguide (CPW) couplers disposed on the substrate and cascaded with each other;
    each CPW coupler comprising:
        two first ground planes disposed on a first side of the substrate;
        a first microstrip line and at least two second microstrip lines which are disposed on the first side of the substrate between the two first ground planes, and can be coupled with each other by electromagnetic coupling; and
        at least one third microstrip line that is disposed on an opposite side of the substrate and electrically connects the at least two second microstrip lines with each other by via-holes.

2. The balun of claim 1, wherein each CPW coupler comprises two second ground planes which are disposed on the opposite side of the substrate and electrically connected to the two first ground planes by via-holes respectively.

3. The balun of claim 1:
    wherein the first microstrip line has one end called a first port and the other end called a third port;
    wherein the at least two second microstrip lines connected as a whole has one end called a second port and the other end called a fourth port;
    wherein the first port of the first CPW coupler is an unbalanced port; and
    wherein the second port of the first CPW coupler and the third port of the second CPW coupler are balanced ports.

4. The balun of claim 3:
    wherein the third port of the first CPW coupler is connected with the second port of the second CPW coupler via a first impedance transformer;
    wherein the fourth port of the first CPW coupler is connected to ground via a third impedance transformer;
    wherein the first port of the second CPW coupler is connected to ground via a fourth impedance transformer; and
    wherein the fourth port of the second CPW coupler is connected to ground via a second impedance transformer.

5. The balun of claim 4:
    wherein the fourth port of the first CPW coupler is connected to the second ground plane by a via-hole; and
    wherein the first port of the second CPW coupler is connected to the second ground plane by a via-hole.

6. The balun of claim 1, wherein a length of a coupling region between the first microstrip line and at least two second microstrip lines is configured to define a desired center frequency of the CPW coupler.

7. The balun of claim 1, wherein a spacing between the first microstrip line and at least two second microstrip lines is configured to define a coupling degree of the CPW coupler.

8. The balun of claim 1, wherein a width of the first microstrip line and/or a width of the second microstrip line is configured to define an impedance of the CPW coupler.

9. The balun of claim 1, wherein the first microstrip line and the at least two second microstrip lines are disposed in parallel with each other.

10. The balun of claim 1, wherein the at least one third microstrip line is disposed perpendicular to the first microstrip line or the at least two second microstrip lines.

11. The balun of claim 1, wherein the first microstrip line takes the form of S-shape, and the second microstrip lines take the form of L-shape.

12. The balun of claim 1, wherein a number of the at least one third microstrip line is two.

13. The balun of claim 1, wherein the balun is configured to operate over a broadband frequency range.

14. The balun of claim 1, wherein the first CPW coupler has the same size as the second CPW coupler.

15. A radio frequency (RF) device, comprising:
    a balun, the balun comprising:
        a substrate;
        a first coplanar waveguide (CPVV) coupler and a second CPW coupler, the CPW couplers disposed on the substrate and cascaded with each other, each CPW coupler comprising:
            two first ground planes disposed on a first side of the substrate;
            a first microstrip line and at least two second microstrip lines which are disposed on the first side of the substrate between the two first ground planes, and can be coupled with each other by electromagnetic coupling; and
            at least one third microstrip line that is disposed on an opposite side of the substrate and electrically connects the at least two second microstrip lines with each other by via-holes.

16. A method for manufacturing a balun, the method comprising:
    providing a substrate; and
    forming first and second cascaded coplanar waveguide (CPVV) couplers on the substrate;
    wherein the forming each CPW coupler comprises:
        forming two first ground planes on a first side of the substrate;
        forming, on the first side of the substrate between the two first ground planes, a first microstrip line and at least two second microstrip lines which can be coupled with each other by electromagnetic coupling; and
        forming, on an opposite side of the substrate, at least one third microstrip line that electrically connects the at least two second microstrip lines with each other by via-holes.

17. The method of claim 16, wherein the forming each CPW coupler comprises: forming, on the opposite side of the substrate, two second ground planes which are electrically connected to the two first ground planes by via-holes respectively.

* * * * *